(12) United States Patent
Barthelmess et al.

(10) Patent No.: US 6,770,917 B2
(45) Date of Patent: Aug. 3, 2004

(54) HIGH-VOLTAGE DIODE

(75) Inventors: Reiner Barthelmess, Soest (DE); Frank Pfirsch, München (DE); Anton Mauder, Kolbermoor (DE); Gerhard Schmidt, Wernberg-Wudmath (AU)

(73) Assignees: Infineon Technologies AG, Munich (DE); Eupec Europaeische Gesellschaft fuer Leistungshalb-Leiter mbH & Co. KG, Warstein (DE)

( * ) Notice: Subject to any disclaimer, the term of this patent is extended or adjusted under 35 U.S.C. 154(b) by 0 days.

(21) Appl. No.: 10/395,425

(22) Filed: Mar. 24, 2003

(65) Prior Publication Data

US 2003/0183900 A1 Oct. 2, 2003

Related U.S. Application Data

(63) Continuation of application No. PCT/DE01/03240, filed on Aug. 24, 2001.

(30) Foreign Application Priority Data

Sep. 22, 2000 (DE) .......................................... 100 47 152

(51) Int. Cl.⁷ ...................... H01L 29/861; H01L 23/58; H01L 23/544
(52) U.S. Cl. ...................... 257/104; 257/490; 257/495; 257/646; 257/648; 257/797
(58) Field of Search ................................ 257/368, 104, 257/106, 105, 488, 490, 494, 495, 496, 551, 603, 604, 605, 622, 623, 624, 625, 626, 646, 648, 797, 500

(56) References Cited

U.S. PATENT DOCUMENTS

| | | | |
|---|---|---|---|
| 4,487,653 A | 12/1984 | Hatcher | 438/492 |
| 4,804,641 A | 2/1989 | Arlt et al. | 438/465 |
| 4,954,868 A | 9/1990 | Bergmann et al. | 257/394 |
| 5,039,358 A | 8/1991 | Birkle et al. | 148/33.3 |
| 6,455,911 B1 | 9/2002 | Stephani et al. | 257/493 |
| 2002/0045321 A1 | 4/2002 | Galster et al. | 438/381 |

FOREIGN PATENT DOCUMENTS

| | | | |
|---|---|---|---|
| DE | 44 10 354 C2 | 10/1995 | 257/495 |
| DE | 198 37 944 A1 | 2/2000 | 257/104 |
| DE | 198 51 461 A1 | 5/2000 | 257/495 |
| EP | 0 264 564 A1 | 4/1988 | 257/495 |
| EP | 0 341 453 A1 | 11/1989 | 257/488 |
| EP | 0 381 111 A2 | 8/1990 | 257/646 |
| EP | 0 400 178 A1 | 12/1990 | 257/623 |
| EP | 0 760 528 A2 | 3/1997 | 257/495 |
| EP | 0 982 768 A1 | 3/2000 | 257/495 |
| JP | 08316500 A | 11/1996 | 257/104 |

OTHER PUBLICATIONS

C. Mingues et al.: "Efficiency of Junction Termination Techniques vs Oxide trapped Charges", *1997 IEEE International Symposium on Power Semiconductor Devices and ICs, Weimar*, pp. 137–140.

Primary Examiner—Steven Loke
(74) Attorney, Agent, or Firm—Laurence A. Greenberg; Werner H. Stemer; Ralph E. Locher

(57) ABSTRACT

A high-voltage diode and a method for producing the high-voltage diode involve only three masking steps. Only three masking steps are required due to the use of adjustment structures and of a chipping stopper with an edge passivation containing a-C:H or a-Si. In this manner, the high-voltage diode is inexpensive to manufacture. The diode has a rating for reverse voltages of, in particular, above about 400 V and preferably above about 500 V, and can be fabricated with the least possible process complexity and thus a small number of photo technologies and, in the edge region, can readily be equipped with a channel stopper for avoiding leakage currents and a chipping stopper for limiting the extent of saving defects.

13 Claims, 2 Drawing Sheets

HIGH-VOLTAGE DIODE

CROSS REFERENCE TO RELATED APPLICATIONS

This application is a continuation of copending International Application No. PCT/DE01/03240, filed Aug. 24, 2001, which designated the United States and was not published in English.

BACKGROUND OF THE INVENTION

Field of the Invention

The present invention relates to a high-voltage diode having a well-type zone of a first conductivity type, which is provided in a first main surface of a semiconductor body having a second conductivity type, being opposite to the first conductivity type. A metal contact is provided on the well-type zone. A rear side metallization is located, opposite to the metal contact, on a second main surface of the semiconductor body. The second main surface is located opposite to the first main surface and an edge termination with a channel stopper is provided. A passivation layer, which is provided on the first main surface in a region between the metal contact and the channel stopper, covers a pn junction issuing at the first main surface.

To date, high-voltage diodes, which are provided for relatively high voltages of, in particular, above about 400 V, have been provided, and use planar structures, with edge terminations containing field plates, field rings, dielectric insulating layers, semi-insulating coverings and a varying doping in the edge region. In this case, these measures are employed individually or in combination, it perfectly well being the case that, by way of example, field plates, field rings and dielectric insulating layers are also used jointly.

In this case, it has been shown that, during the fabrication of the diode, even more steps are necessary for an edge termination that satisfies the requirements made of it than for setting the desired on-state and switching properties. Thus, by way of example, diode edges based on field plates require relatively complicated fabrication processes.

Specifically, in the reference by C. Mingues and G. Charitat, titled "Efficiency of Junction Termination Techniques vs. Oxide Trapped Charges", 1997 IEEE International Symposium on Power Semiconductor Devices and ICs, Weimar, pages 137 to 140, edge terminations with field rings, semi-insulating layers or a junction termination extension (JTE) are compared with one another especially with regard to their sensitivity to oxide charges. In this case, the use of SIPOS techniques is recommended as semi-insulating layers for high-voltage applications.

European Patent EP 0 341 453 B1, corresponding to U.S. Pat. No. 4,954,868, discloses a MOS semiconductor component for a high reverse voltage, in which field plates are disposed on insulating layers of different thicknesses. In this case, some of the field plates serve as channel stoppers. In diodes, such field plates used as channel stoppers are often connected to the rear side potential of the diode by a p-conducting region in the edge region, even though a connection via an n-conducting region would inherently be more advantageous because a p-conducting channel could thereby be reliably prevented. However, given an otherwise customary fabrication process, an additional mask step would be necessary for such a connection via an n-conducting region.

When sawing a wafer into individual chips, so-called chipping stoppers are intended to prevent crystal defects from propagating from the sawing edge into the active region of the respective chips. The chipping stoppers are usually realized by a field oxide between the functional edge region of the chip and the sawing line.

If pn junctions having a high blocking capability are only covered with dielectric passivation layers, then under the action of external charges which are attributable for example to moisture, alkaline or metallic contamination, etc., changes in the long-term blocking stability can be observed in the event of blocking loading of the pn junction. These changes are brought about by a drift of ionic charges in the electric field of the reverse-biased pn junction on or in the passivation layer. Depending on the sign of the ionic charges and also depending on the structure of the edge termination, that is to say depending on the so-called edge contour, the ionic charges can lead to an increase or to a decrease in the blocking capability of the pn junction. In the case of a diode with a p-conducting anode, in this case, as the doping in the n-conducting base decreases and therefore as the bulk blocking capability of the diode increases, as a result of a greater induction effect, the influence of such surface charges in and on the passivation layer increases, which leads to a dramatic increase in the risk of blocking instabilities. In this connection, reference should be made to the so-called Yoshida effect; when using insulator layers for passivation, a drift in the reverse voltage is occasionally observed on account of an injection of hot electrons during the on-state loading when changing over to the blocking state of the pn junction.

By using semi-insulating layers directly on the pn junctions, the influence of such surface charges can be suppressed given suitable settings of the layer and interface parameters, such as, for example, of the layer thickness and doping of the semi-insulating layers. The semi-insulating layers which are currently used for the passivation of pn junctions contain, for example, amorphous silicon (a-Si) or hydrogen-doped amorphous carbon (a-C:H), as are described in European Patents EP 0 400 178 B1 and EP 0 381 111 B1 (corresponding to U.S. Pat. No. 5,039,358). With these semi-insulating layers, parasitic effects, such as an elevated reverse current or the formation of inversion layers, can be avoided given corresponding optimization of the amorphous-crystalline heterojunctions between the layers and the electrically active silicon substrate. Moreover, semi-insulating passivation layers can actively build up image charges by virtue of their finite state density and thus shield extraneous charges that penetrate externally, and also dissipate injected charge carriers by virtue of their finite specific conductivity. Overall, a semi-insulating passivation thus leads to a significantly improved long-term stability compared with a dielectric passivation.

SUMMARY OF THE INVENTION

It is accordingly an object of the invention to provide a high-voltage diode and a method for fabricating the high-voltage diode that overcomes the above-mentioned disadvantages of the prior art devices of this general type, which has a rating for reverse voltages of, in particular, above about 400 V and preferably above about 500 V, and can be fabricated with the least possible process complexity and thus a small number of photo technologies and, in the edge region, can readily be equipped with a channel stopper for avoiding leakage currents and a chipping stopper for limiting the extent of saving defects; moreover, the intention is to provide a method for fabricating such a high-voltage diode.

With the foregoing and other objects in view there is provided, in accordance with the invention, a high-voltage diode. The diode contains a semiconductor body having a first main surface and a second main surface disposed opposite the first main surface, the semiconductor body is formed of a second conductivity type being opposite to a first conductivity type. A well-type zone of the first conductivity type is disposed in the first main surface of the semiconductor body. A metal contact is disposed on the well-type zone. A rear side metallization is disposed on the second main surface of the semiconductor body and disposed opposite to the metal contact. An edge termination having a channel stopper is provided. A passivation layer is disposed on the first main surface in a region between the metal contact and the channel stopper. The passivation layer covers a pn junction issuing at the first main surface. The passivation layer contains an amorphous carbon doped with hydrogen or an amorphous silicon and serves as a chipping stopper in a region of the semiconductor body outside the channel stopper. At least one edge is provided as an alignment structure disposed in the first main surface in a region of the well-type zone.

The measures of producing the masking insulating layer on the semiconductor body and the patterning of the mask insulating layer for the purpose of producing at least one window for the well-type zone each serve individually per se to enable a high-voltage diode which can be fabricated with a low outlay for masks and alignment and has a channel stopper, chipping stopper, etc. These measures can advantageously be employed jointly. It goes without saying, however, that it is also possible to provide a high-voltage diode that realizes only one of these measures.

The high-voltage diode according to the invention may be a fast diode exhibiting switching strength or, alternatively, a rectifier and universal diode in various voltage and current classes. The high-voltage diode may have one or a plurality of field rings depending on the desired voltage class in its edge region.

Preferably, in the case of the high-voltage diode according to the invention, the semiconductor body contains n-conducting silicon into which a p-conducting well-type zone is introduced.

Instead of an n-conducting silicon body, however, it is also possible to provide a p-conducting silicon body having an n-conducting well-type zone.

The semiconductor material is not limited to silicon. Instead of silicon, it is also possible to use, by way of example, SiC or an $A_{III}B_V$ semiconductor material.

In accordance with an added feature of the invention, the edge termination has at least one field ring.

In accordance with an additional feature of the invention, the channel stopper is provided on the semiconductor body. More specifically, the channel stopper is preferably provided on a region of the first conductivity type.

In accordance with a further feature of the invention, a field stop layer of the second conductivity type is disposed between the semiconductor body and the rear side metallization. A doped emitter layer of the second conductivity type is disposed between the semiconductor body and the rear side metallization being a cathode metallization.

In accordance with another feature of the invention, the alignment structure is one of a plurality of alignment structures, the alignment structures contain silicon steps in the first main surface with a height of between about 10–1,000 nm, preferably with a height of between about 50–200 nm.

In accordance with another additional feature of the invention, the alignment structures are located outside the metal contact being an anode contact.

In accordance with another further feature of the invention, the semiconductor body has a sawing edge, and the passivation layer does not reach as far as the sawing edge.

In accordance with a further added feature of the invention, an annular zone of the first conductivity type, being uncovered at the first main surface, is disposed in a region of the sawing edge.

In accordance with a further additional feature of the invention, the well-type zone is doped with a dose of $1.3–3 \times 10^{12}$ dopant atoms cm$^{-2}$ to operate the high-voltage diode as a fast freewheeling diode. The well-type zone has a surface region doped with a dose of between $1.3 \times 10^{12}$ dopant atoms cm$^{-2}$ and $5 \times 10^{13}$ dopant atoms cm$^{-2}$.

In accordance with a concomitant feature of the invention, the edge termination has a plurality of field rings.

With the foregoing and other objects in view there is provided, in accordance with the invention, a method for fabricating a high-voltage diode. The method includes the steps of:

(a) producing a mask insulating layer on a semiconductor body;

(b) patterning the mask insulating layer resulting in a patterned mask insulation layer and windows, at least one of the windows provided for a well-type zone;

(c) producing steps functioning as alignment structures in the semiconductor body through the windows;

(d) producing the well-type zone through the window with in each case a first conductivity type opposite to a second conductivity type of the semiconductor body;

(e) removing the patterned mask insulating layer;

(f) applying and patterning a passivation layer using a lithography step aligned using the alignment structures resulting in a patterned passivation layer with further windows, the passivation layer is made from amorphous carbon doped with hydrogen or amorphous silicon;

(g) applying and patterning a metal contact and a channel stopper in the further windows of the patterned passivation layer on a front side of the well-type zone and of the semiconductor body respectively; and (h) applying a metallization on a rear side of the semiconductor body.

In accordance with an added mode of the invention, there is the step of patterning the mask insulating layer for use in forming a field ring and a chipping stopper ring during method step (b).

In accordance with an additional mode of the invention, at least one of the following steps is performed before or after method step (d):

(i) thinning by grinding and/or etching of the semiconductor body to a final thickness;

(j) introducing a doping of the second conductivity type for forming a field stop layer on the rear side of the semiconductor body and outdiffusing the doping;

(k) introducing an n-conducting doping on the rear side of the semiconductor body as a rear side emitter using ion implantation;

(l) introducing heavy metal atoms for setting a charge carrier lifetime; and (m) diffusing the heavy metal atoms.

In accordance with another mode of the invention, there is the step of performing one of the method steps (l) and (m) before or after method step (d).

In accordance with a further mode of the invention, there is the step of carrying out the method steps (i) to (k) after method steps (l) and (m) are completed.

In accordance with a further added mode of the invention, there is the step of carrying out the following method step after method step (e) and before method step (f):

(n) irradiating at least one of the semiconductor body and the well-type zone and rings contained therein for setting the charge carrier lifetime.

In accordance with a further additional mode of the invention, the following method step is carried out after method step (f) and before method step (g):

(o) irradiating at least one of the semiconductor body and the well-type zone and rings contained therein for setting the charge carrier lifetime.

In accordance with another added mode of the invention, at least one of the following method steps is carried out after method step (g):

(p) heat treating a front side metallization made of the metal contact and the channel stopper; and (q) irradiating the semiconductor body and the zone and rings contained therein for setting the charge carrier lifetime.

In accordance with another additional mode of the invention, there is the step of carrying out method steps (i) and (k) after method step (q).

In accordance with another further mode of the invention, there is the step of carrying out the following method step after method step (h):

(r) heat treating the metallization on the rear side of the semiconductor body.

In accordance with an added mode of the invention, there is the step of forming the mask insulating layer in a furnace process with moist oxidation up to a layer thickness of about 0.5 μm.

In accordance with an additional mode of the invention, there is the step of introducing the alignment structures into the semiconductor body by etching down to a depth between 10–1,000 nm, preferably to a depth between 50–200 nm. Preferably, an isotropic etching is used for the etching.

In accordance with a further mode of the invention, there is the step of providing the alignment structures with a spacing with respect to the windows.

In accordance with a concomitant feature of the invention, there is the step of carrying out only three phototechnology steps for fabricating the high-voltage diode.

Other features which are considered as characteristic for the invention are set forth in the appended claims.

Although the invention is illustrated and described herein as embodied in a high-voltage diode and a method for fabricating the high-voltage diode, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
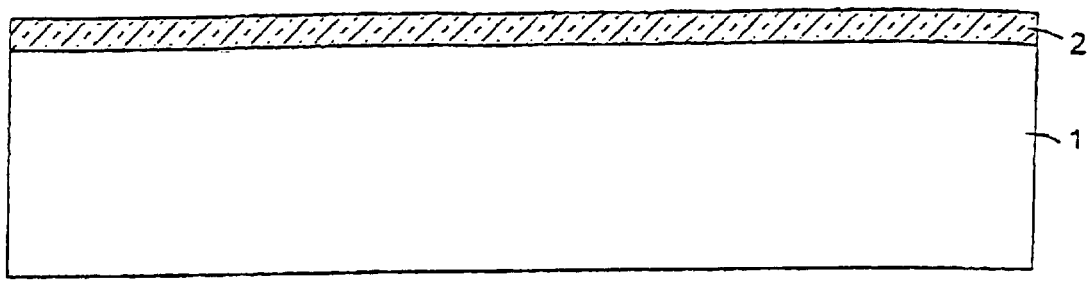
FIGS. 1 to 5 are diagrammatic, sectional views illustrating different steps for fabricating a high-voltage diode according to the invention.

Referring now to the figures of the drawing in detail and first, particularly, to FIG. 1 thereof, there is shown an n-conducting silicon substrate 1, to which a silicon dioxide layer 2 having a thickness of about 0.5 μm is applied on the front side in a furnace process with moist oxidation, for example. Instead of silicon dioxide, a different material, for example silicon nitride, may also be chosen, if appropriate, for the layer 2.

In the silicon dioxide layer 2, structures are then introduced for forming an anode of a diode and, if appropriate, in an edge region for field rings by photolithography. For this purpose, a photoresist layer is applied to the silicon dioxide layer 2, exposed and developed. During the development, the regions of the photoresist layer in which the anode and, if appropriate, the field rings are intended to be produced are removed. An etchant, for example during a wet-chemical etching, is caused to act on the silicon dioxide layer 2 uncovered in this way, in order to remove the silicon dioxide layer 2 in the regions mentioned.

Figure 2:
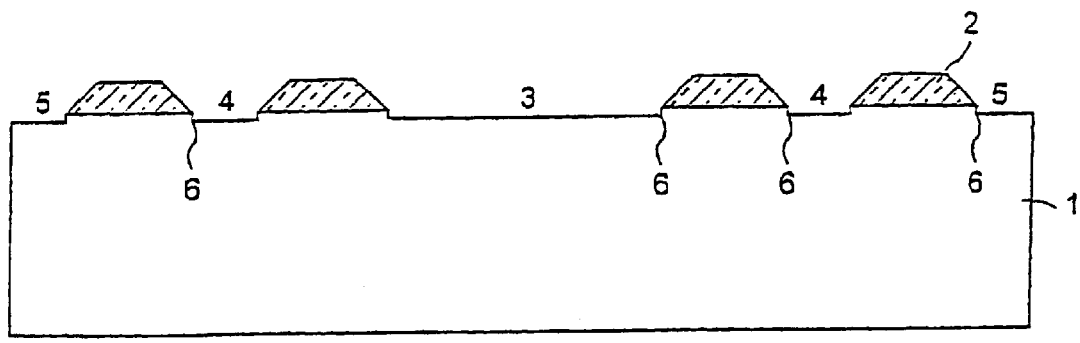

A further etching step then follows, which effects a silicon removal of, for example, 10 . . . 1,000 nm, preferably 50 . . . 200 nm, in the uncovered surface of the silicon substrate 1, that is to say in the regions of the "windows" introduced into the silicon dioxide layer 2. The silicon removal can be effected by way of the photoresist that is still present or by way of the silicon dioxide layer 2 that remains after the removal of the photoresist. The configuration shown in FIG. 2 is thus obtained, which configuration shows on the silicon substrate 1 the remaining parts of the silicon dioxide layer 2 and in windows 3 to 5 for an anode (window 3), a field ring (window 4) and alignment structures which are defined in a scribe line at the edge of the respective semiconductor chip (right-hand edge in FIG. 2) (window 5). Instead of one field ring, it is also possible to provide a plurality of field rings. If appropriate, the field rings can also be dispensed with. The alignment is effected at residual edges or steps 6 of the window 5 that form the alignment structures.

During the etching of the silicon substrate 1 in the windows 3 to 5, the silicon dioxide layer 2 can be etched back further wet-chemically by way of the resist mask still present, in order to produce a certain spacing 7 between p-type dopings, that are to be introduced later in the windows 3 to 5 and the edges 6 of the alignment structures or the step formed by the latter in the silicon substrate 1. The residual photoresist is removed at the latest after this optionally effected etching-back. As a result, the configuration present is that shown in FIG. 2 (without additional etching-back of the silicon substrate) or in FIG. 3 (with additional etching-back of the silicon substrate).

It should also be noted that, in the present exemplary embodiment, the silicon removal is effected in the windows 3 to 5. At the very least the removal is effected in the window 3, in order to produce an edge or step as an alignment structure in the region of a well 8 outside an anode contact 13 (see FIG. 5).

The configuration shown in FIG. 2 can thus be produced in such a way that the silicon removal is effected in the windows 3 to 5 by way of the residual silicon dioxide layer 2 (oxide mask) or by way of the photoresist that is still present on the silicon dioxide layer 2.

Figure 3:
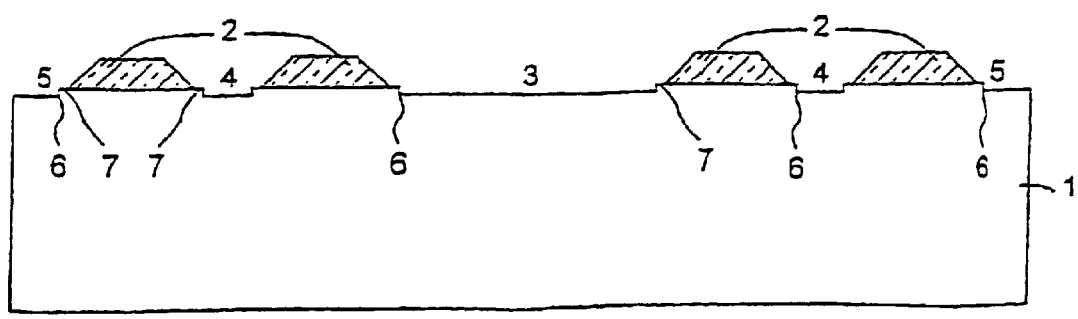

It is assumed below that the configuration of FIG. 3 is processed further. However, it is also possible to process the configuration of FIG. 2 in a corresponding manner. In this case, however, the spacing 7 between the edge of the residual silicon dioxide layer 2 and the edges 6 of the alignment structures is not present. Rather, the edges 6 of the alignment structures then directly adjoin the edge of the windows 3 to 5 in positional terms.

Figure 4:
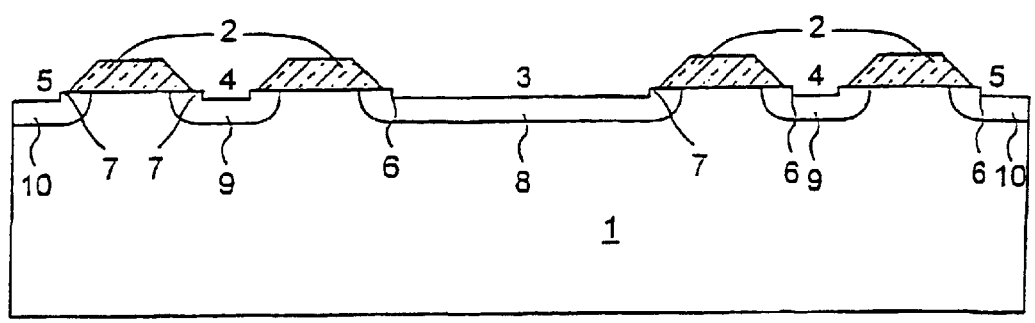

There then follows a p-type doping, for example with boron, in order to produce the p-conducting well-type zone 8, a p-conducting field ring 9 and, in the region of a chipping stopper, a p-conducting ring 10, as are illustrated in FIG. 4. The well-type zone 8 and also the field ring 9 and the ring 10 can be fabricated for example in one stage by ion implantation or else in multistage fashion. It is thus possible, especially in the case of rapidly switching diodes, for the zone 8, to provide the latter with a $p^+$-conducting anode emitter having a small penetration depth, whose dopant dose lies between $1.3 \times 10^{12}$ dopant atoms $cm^{-2}$ and $5 \times 10^{13}$ dopant atoms $cm^{-2}$, and to dope the remainder of the zone 8 with a dose of about $(1.3 \ldots 3) \times 10^{12}$ dopant atoms $cm^{-2}$ (in this respect, see Published, Non-Prosecuted German Patent Application DE 100 31 461 A1).

For the further processing of the configuration shown in FIG. 4, there are now different variants in which necessary process steps are effected. An n-type doping (for example phosphorus) is introduced on the rear side of the semiconductor substrate 1, that is to say the wafer rear side, as a rear side emitter for the purpose of forming an $n^+$-conducting silicon layer 11 for example by ion implantation. The etching-away of the residual silicon dioxide layer 2 (sacrificial oxide) on the wafer front side, the application and patterning of an edge passivation layer 12 with a chipping stopper 12a made of in each case from amorphous carbon doped in particular with hydrogen (a-C:H) using a lithography step are performed. The deposition and patterning of a front side metallization made, for example, of AlSi for the purpose of forming the anode contact 13 and a channel stopper 14 is done. The deposition of a rear side metallization made, for example, of AlSi for the purpose of forming a cathode contact 15 is also performed. Optional process steps, such as thinning by grinding or etching of the silicon substrate 1 from the rear side to a final thickness, the introduction of an n-conducting doping as a field stop layer 16 on the wafer rear side and outdiffusion of the n-conducting doping, the introduction of heavy metal atoms for the purpose of setting the charge carrier lifetime, heavy metal diffusion, irradiation for the purpose of setting the charge carrier lifetime, the heat treatment of the front side metallization and the heat treatment of the rear side metal, are possible. During these process steps, if necessary, the edges 6 are used as alignment structures. In this case, it is even possible to affect the p-conducting dopings for the zone 8, the field ring 9 and the ring 10, that is to say the introduction of the front side p-type contact and of the p-conducting emitter, respectively, by ion implantation, at a later point in time.

These individual process variants are compiled in the table below. In this case, process variant 1 is particularly suitable for basic material containing silicon substrate wafers obtained by zone refining (FZ), while process variants 2 and 3 are also advantageous for Czochralski (CZ) substrate wafers or wafers provided with epitaxial layers or diffused wafers.

The edge passivation layer 12 (and thus the chipping stopper 12a) may, if appropriate, also contain amorphous silicon (a-Si).

| Process variant 1 for; basic material: Si-FZ substrate wafers | Process variant 2 for: basic material: Si-FZ/CZ substrate wafers or epitaxial or diffused wafers | Process variant 3 for: basic material: Si-FZ/CZ substrate wafers or epitaxial or diffused wafers |
|---|---|---|
| | | Thinning by grinding/etching to final thickness |
| | | If appropriate, introduction of an n-type doping on the wafer rear side as rear side emitter e.g. by ion implantation. |
| If appropriate introduction of heavy metal atoms for the purpose of setting the charge carrier lifetime | If appropriate introduction of heavy metal atoms for the purpose of setting the charge carrier lifetime | If appropriate introduction of heavy metal atoms for the purpose of setting the charge carrier lifetime |
| If appropriate heavy metal diffusion | If appropriate heavy metal diffusion | If appropriate heavy metal diffusion |
| | | Thinning by grinding/etching to final thickness |
| | | If appropriate introduction of an n-type rear side contact e.g. by implantation with subsequent annealing step |
| If appropriate only now introduction of the front side p-type contact/p-type emitter by ion implantation | If appropriate only now introduction of the front side p-type contact/p-type emitter by ion implantation | If appropriate only now introduction of the front side p-type contact/p-type emitter by ion implantation |
| Etching-away of the sacrificial oxide on the front side | Etching-away of the sacrificial oxide on the front side | Etching-away of the sacrificial oxide on the front side |
| If appropriate irradiation for the purpose of setting the charge carrier lifetime | If appropriate irradiation for the purpose of setting the charge carrier lifetime | If appropriate irradiation for the purpose of setting the charge carrier Lifetime |
| Application of the edge passivation, e.g. made of a-C:H | Application of the edge passivation, e.g. made of a-C:H | Application of the edge passivation, e.g. made of a-C:H |
| If appropriate irradiation for the purpose of setting the charge carrier lifetime | If appropriate irradiation for the purpose of setting the charge carrier lifetime | If appropriate irradiation for the purpose of setting the charge carrier lifetime |
| Deposition patterning of the front side metallization, e.g. made of AlSi | Deposition patterning of the front side metallization, e.g. made of AlSi | Deposition patterning of the front side metallization, e.g. made of AlSi |
| If appropriate heat treatment of the front side metallization | If appropriate heat treatment of the front side metallization | If appropriate heat treatment of the front side metallization |
| If appropriate irradiation for the purpose of | If appropriate irradiation for the purpose of | If appropriate irradiation for the purpose of |

-continued

| Process variant 1 for; basic material: Si-FZ substrate wafers | Process variant 2 for: basic material: Si-FZ/CZ substrate wafers or epitaxial or diffused wafers | Process variant 3 for: basic material: Si-FZ/CZ substrate wafers or epitaxial or diffused wafers |
| --- | --- | --- |
| setting the charge carrier lifetime | setting the charge carrier lifetime Thinning by grinding/etching to final thickness Introduction of an n-type doping on the wafer rear side as rear side contact e.g. by ion implantation | setting the charge carrier lifetime |
| Deposition of rear side metal If appropriate heat treatment of the rear side metal | Deposition of rear side metal If appropriate heat treatment of the rear side metal | Deposition of rear side metal If appropriate heat treatment of the rear side metal |

In the different process variants above, the process step "if appropriate irradiation for the purpose of setting the charge carrier lifetime" is performed repeatedly since, depending on the dose used during the ion implantation and the type of beam, thermal budgets of different magnitudes are required for annealing beam damage.

The edge passivation layer 12 contains, in particular, amorphous carbon doped with hydrogen acts in part as the chipping stopper 12a and prevents the propagation of crystal defects proceeding from a scribe line into an active region during the singulation or sawing of a silicon wafer into chips. In the scribe line itself, in this case the passivation layer 12 is open analogously to the contact holes for the anode contact 13 and the channel stopper 14, but here no covering with metal is effected.

The channel stopper 14 acts as a field plate and prevents the further propagation of a space charge zone outward into the scribe line. As a result, it is possible to reduce the required edge width especially in the case of a high-impedance basic material for the silicon substrate 1.

Figure 5:
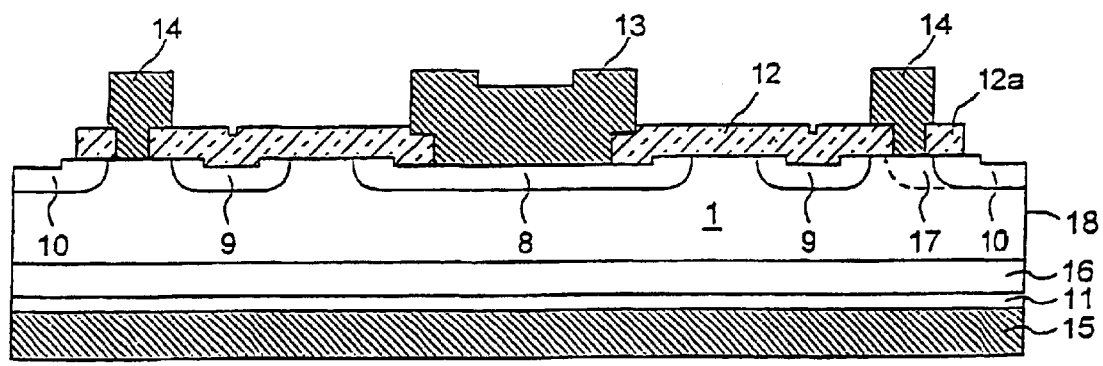

The channel stopper 14 may also be connected to a p-conducting region, as is indicated by a dashed line 17 in FIG. 5. The p-conducting region should then have the same electrical potential as the rear side of the silicon substrate, that is to say be connected to the cathode contact 15.

It is particularly advantageous, however, if the channel stopper 14 is directly connected to an n-conducting region, as is shown in FIG. 5.

In addition to the field ring 9, further field rings 9 may also be present, if appropriate, between the active region, that is to say the well-type zone 8, and a sawing edge 18, all or some of which further field rings may, moreover, be provided with metal structures. The field ring 9 may also have such a metal structure.

By virtue of the alignment structures 6 located outside the anode contact 13 and the embodiment of the chipping stopper 12a in the edge region by the passivation layer 12, the high-voltage diode according to the invention can be fabricated by merely three masking steps in total for the production of the patterned silicon dioxide layer 2, the passivation layer 12 and the front side metallization made of the anode contact 13 and the channel stopper 14. The alignment structure 6 can advantageously be utilized in this case, which alignment structure allows a precise positioning of, for example, the anode contact 13 and the channel stopper 14.

We claim:

1. A high-voltage diode, comprising:
   a semiconductor body having a first main surface and a second main surface disposed opposite said first main surface, said semiconductor body formed of a second conductivity type being opposite to a first conductivity type;
   a well-type tone of said first conductivity type disposed in said first main surface of said semiconductor body;
   a metal contact disposed on said well-type zone;
   a rear side metallization disposed on said second main surface of said semiconductor body and dispersed opposite to said metal contact;
   an edge termination having a channel stopper;
   a passivation layer disposed on said first main surface in a region between said metal contact and said channel stopper, said passivation layer covers a pn junction issuing at said first main surface, said passivation layer containing one of amorphous carbon doped with hydrogen and amorphous silicon and serves as a chipping stopper in a region of said semiconductor body outside said channel stopper; and
   at least one edge provided as an alignment structure disposed in said first main surface in a region of said well-type zone.

2. The high-voltage diode according to claim 1, wherein said edge termination has at least one field ring.

3. The high-voltage diode according to claim 1, wherein said channel stopper is provided on said semiconductor body.

4. The high-voltage diode according to claim 1, wherein said channel stopper is provided on a region of said first conductivity type.

5. The high-voltage diode according to claim 1, further comprising:
   a field stop layer of said second conductivity typo disposed between said semiconductor body and said rear side metallization; and
   a doped emitter layer of said second conductivity type disposed between said semiconductor body and said rear side metallization being a cathode metallization.

6. The high-voltage diode according to claim 1, wherein said alignment structure is one of a plurality of alignment structures, said alignment structures contain silicon steps in said first main surface with a height of between about 10–1,000 nm.

7. The high-voltage diode according to claim 6, wherein said alignment structures are located outside said metal contact being an anode contact.

8. The high-voltage diode according to claim 1, wherein said semiconductor body has a sawing edge, and said passivation layer does not reach as far as said sawing edge.

9. The high-voltage diode according to claim 8, further comprising an annular zone of said first conductivity type being uncovered at said first main surface and disposed in a region of said sawing edge.

10. The high-voltage diode according to claim 1, wherein said well-type zone is doped with a dose of $1.3–3 \times 10^{12}$ dopant atoms $cm^{-2}$ to operate the high-voltage diode as a fast freewheeling diode.

11. The high-voltage diode according to claim 10, wherein said well-type zone has a surface region doped with a dose of between $1.3 \times 10^{12}$ dopant atoms $cm^{-2}$ and $5 \times 10^{13}$ dopant atoms $cm^{-2}$.

12. The high-voltage diode according to claim 1, wherein said edge termination has a plurality of field rings.

13. The high-voltage diode according to claim 1, wherein said alignment structure is one of a plurality of alignment structures, said alignment structures contain silicon steps in said first main surface with a height of between about 50–200 nm.

* * * * *